United States Patent
Kajino et al.

(10) Patent No.: US 12,024,435 B2
(45) Date of Patent: Jul. 2, 2024

(54) SINTERED METAL CARBIDE AND HEAT-RESISTANT MEMBER FOR SILICON CARBIDE SEMICONDUCTOR MANUFACTURING DEVICE COMPRISING SAME

(71) Applicant: Mitsui Mining & Smelting Co., Ltd., Tokyo-to (JP)

(72) Inventors: Hitoshi Kajino, Omuta (JP); Shoji Imaura, Omuta (JP)

(73) Assignee: Mitsui Mining & Smelting Co., Ltd. (JP)

( * ) Notice: Subject to any disclaimer, the term of this patent is extended or adjusted under 35 U.S.C. 154(b) by 967 days.

(21) Appl. No.: 16/969,338

(22) PCT Filed: Feb. 8, 2019

(86) PCT No.: PCT/JP2019/004697
§ 371 (c)(1),
(2) Date: Aug. 12, 2020

(87) PCT Pub. No.: WO2019/159851
PCT Pub. Date: Aug. 22, 2019

(65) Prior Publication Data
US 2021/0024357 A1    Jan. 28, 2021

(30) Foreign Application Priority Data

Feb. 13, 2018   (JP) ................................ 2018-023079

(51) Int. Cl.
*C01B 32/921* (2017.01)
*C01B 32/914* (2017.01)
*H01L 29/16* (2006.01)

(52) U.S. Cl.
CPC .......... *C01B 32/921* (2017.08); *C01B 32/914* (2017.08); *C01P 2006/10* (2013.01); *C01P 2006/16* (2013.01); *C01P 2006/37* (2013.01); *C01P 2006/80* (2013.01); *H01L 29/1608* (2013.01)

(58) Field of Classification Search
None
See application file for complete search history.

(56) References Cited

U.S. PATENT DOCUMENTS

| 4,161,512 | A | * | 7/1979 | Merzhanov | ........... C01B 32/921 |
| | | | | | 423/440 |
| 5,194,237 | A | * | 3/1993 | Cliche | ..................... C22C 1/055 |
| | | | | | 423/440 |
| 5,942,204 | A | * | 8/1999 | Dunmead | ............. C01B 32/914 |
| | | | | | 423/440 |
| 2010/0239885 | A1 | | 9/2010 | Nakamura | |
| 2013/0280466 | A1 | | 10/2013 | Zwieback et al. | |

FOREIGN PATENT DOCUMENTS

| CA | 2679553 | * | 10/2008 | ............. C01B 31/34 |
| CN | 103172380 | A | 6/2013 | |
| JP | H05319930 | A | 12/1993 | |
| JP | H07172906 | A | 7/1995 | |
| JP | 2004091241 | A | 3/2004 | |
| JP | 2009137789 | A | 6/2009 | |
| JP | 2010248060 | A | 11/2010 | |
| JP | 2015514673 | A | 5/2015 | |
| JP | 20164933 | A | 1/2016 | |
| WO | WO 2009/051888 | A1 * | 4/2009 | ............. C01B 31/36 |
| WO | WO 2015/140328 | A1 * | 9/2015 | ........... C01B 21/076 |

OTHER PUBLICATIONS

English translation of the International Preliminary Report on Patentability and Written Opinion for corresponding International Application No. PCT/JP2019/004697 dated Aug. 18, 2020 (10 Pages).
International Search Report (in English and Japanese) issued in PCT/JP2019/004697, mailed Mar. 3, 2019; ISA/JP.
Chinese Office Action issued for the corresponding Chinese Patent Application No. 201980013179.5; dated Nov. 23, 2021 (total 15 pages).
Guihong Geng et al., "Microstructure and mechanical properties of TaC ceramics with 1-7.5mol% Si as sintering aid"; Journal of the American Ceramic Society; vol. 100, Phase 6, pp. 2461-2470; article received on Sep. 16, 2016 and accepted on Jan. 16, 2017 (total 10 pages).

* cited by examiner

*Primary Examiner* — Wayne A Langel
(74) *Attorney, Agent, or Firm* — Harness, Dickey & Pierce, P.L.C.

(57) ABSTRACT

Out of sintered metal carbides having an extremely high melting point, there is provided a sintered metal carbide which can be produced without having to perform sintering under high pressure such as hot pressing or HIP, having a high relative density and excellent mechanical strength. A sintered metal carbide of at least one metal selected from the group consisting of elements of Groups 4 and 5 of the periodic table, wherein the sintered metal carbide contains Si element of 0.1 wtppm or more and 10,000 wtppm or less.

10 Claims, No Drawings

SINTERED METAL CARBIDE AND HEAT-RESISTANT MEMBER FOR SILICON CARBIDE SEMICONDUCTOR MANUFACTURING DEVICE COMPRISING SAME

CROSS REFERENCE TO RELATED APPLICATIONS

This application is a U.S. National Stage Application of International Application No. PCT/JP2019/004697, filed on Feb. 8, 2019, and claims priority to Japanese Patent Application No. 2018-023079, filed on Feb. 13, 2018. The entire disclosures of the above applications are expressly incorporated herein by reference.

BACKGROUND

Technical Field

The present invention relates to a sintered metal carbide, and more particularly to a sintered metal carbide which can be suitably used as a heat-resistant member or the like for a silicon carbide semiconductor manufacturing device.

Related Art

Silicon carbide (SiC) semiconductors have the characteristics of not only higher heat resistance than silicon (Si) semiconductors but also a wide band gap and high dielectric breakdown field intensity, and therefore are of interest as semiconductor materials for low-energy-loss power devices, and are especially expected to be a key material for electronic components for automobiles. Since SiC does not melt under normal pressure but sublimates at a temperature of about 2000° C., CZ method and FZ method used for the production of Si single crystals cannot be adopted for the production of SiC single crystals. Therefore, the main adopted method for mass production of SiC single crystals is the sublimation method such as an improved Rayleigh method. In recent years, since there has been a demand for increasing the diameter of SiC single crystal wafers, and a method for efficiently obtaining SiC single crystals with low defects and high quality has been sought, other manufacturing methods than the sublimation method (solution method, gas growth method, etc.) are also of interest.

In any of the above-described methods, a raw material (powder, gas, etc.) is supplied to a heat-resistant container (crucible, furnace tube, etc.) such as of graphite, and the raw material is heated by means of such as high-frequency heating from the outside of the vessel, and SiC single crystal growth is carried out in an ultra-high temperature range of 2000° C. or higher. Although graphite is known to be a material having a heat resistance of 2500° C. or higher, the surface of the graphite container is exposed to sublimation gas such as $Si_2C$ or $SiC_2$ sublimated by high-temperature heating or reactive gas derived from raw material gas such as $SiH_4$, $H_2$, or hydrocarbon in the above-described SiC single crystal growth method. Since the graphite will sublimate under the presence of such reactive gas, the heat resistance of the container is significantly lowered. Therefore, it is necessary to use a container made of a metal carbide having a melting point much higher than that of graphite (e.g., tantalum carbide, niobium carbide, etc.) instead of the graphite container.

The SiC semiconductor device is manufactured by means of a wafer cut from a bulk single crystal of SiC and growing an SiC epitaxial film on the wafer by a chemical vapor deposition (CVD) method, a physical vapor deposition (PVD) method, or the like. In a film forming device used for manufacturing such a SiC semiconductor device, it is necessary to heat the SiC single crystal wafer serving as a substrate to a high temperature by means of high-frequency induction heating or the like and maintain the temperature, and therefore, it has been proposed to use a metal carbide material having high heat resistance as a heat-resistant member in the film forming device as well (for example, JP 2015-514673 A1 and JP 2016-4933 A1).

Incidentally, carbides (metal carbides) of elements belonging to Groups 4 and 5 of the periodic table are known to have extremely high melting points so that it is not possible to increase the relative density even by sintering at a high temperature, and thus it is difficult to obtain a sintered body having excellent mechanical strength. Therefore, various methods have been proposed for obtaining a sintered body having excellent mechanical strength. For example, proposed is a method in which a sintering method using high-pressure press, hot press, discharge plasma sintering, HIP treatment, or the like is applied to obtain a sintered body having a high relative density even the used material was a metal carbide having an extremely high melting point such as tantalum carbide (for example, JPH05-319930 A1 and JP 2009-137789 A1).

Although the methods proposed in JPH05-319930 A1 and JP 2009-137789 A1 are suitable for obtaining a sintered body having a relatively simple shape such as a cutting tool, a shelf plate of a furnace material, since pressure needs to be applied at the time of sintering, it is not easy to produce a sintered body having a complicated shape. Therefore, there is still room for improvement in order to practically use the sintered metal carbide such as tantalum carbide as a heat resistant member for a crucible for manufacturing SiC single crystals or a film forming device for manufacturing SiC semiconductor devices.

Therefore, the object of the present invention is to provide a sintered metal carbide having a very high melting point which can be produced without sintering under high pressure such as hot pressing or HIP, and which has a high relative density and excellent mechanical strength.

SUMMARY

The present inventors have investigated such problem and obtained the knowledge that even with a metal carbide which has a high melting point and is uneasily sintered, such as a carbide of metals belonging to Groups 4 and 5 of the periodic table, the addition of small amount of Si makes it possible to obtain a sintered metal carbide having a high relative density and excellent mechanical strength by sintering under normal pressure. The present invention is based on the above knowledge. According to the present invention, there are provided the following sintered metal carbide and heat-resistant member for a silicon carbide semiconductor manufacturing device comprising the same.

The sintered metal carbide according to the present invention is a sintered carbide of at least one of metals selected from the group consisting of Group 4 and Group 5 elements of the periodic table, comprising:

0.1 wtppm or more and 10,000 wtppm or less of Si element.

The heat-resistant member for a silicon carbide semiconductor manufacturing device according to another embodiment of the present invention comprises the sintered metal carbide.

Effect of the Invention

According to the present invention, since a predetermined amount of Si element is contained in the sintered metal carbide, it is possible to obtain a sintered body having a high relative density without having to perform sintering under pressure. Therefore, there is no need to perform sintering under pressure such as hot pressing or HIP, which was conventionally required to obtain a sintered body having a high relative density, and a sintered body having a high relative density and excellent mechanical strength can be obtained by sintering at normal pressure even if the shape is relatively complicated. Therefore, the sintered metal carbide according to the present invention can be suitably used as a heat-resistant member in a device for producing silicon carbide (SiC) single crystal bulks or a heat-resistant member in a film-forming device for producing silicon carbide semiconductor wafers.

DETAILED DESCRIPTION

Sintered Metal Carbide

The sintered metal carbide according to the present invention is a sintered carbide of at least one of metals selected from the group consisting of elements of Groups 4 and 5 of the periodic table, and contains 0.1 wtppm or more and 10,000 wtppm or less of Si element. Carbides of metals such as titanium (Ti), zirconium (Zr), hafnium (Hf), vanadium (V), niobium (Nb) and tantalum (Ta), which are elements of Group 4 and Group 5 of the periodic table, are known as metal carbides having high melting points. For example, the melting point (Tm) of titanium carbide is 3530° C., the Tm of zirconium carbide is 3803° C., the Tm of hafnium carbide is 3887° C., the Tm of niobium carbide is 3800° C., and the Tm of tantalum carbide is 3880° C. With these metal carbides having high melting points, it is unlikely to obtain a sintered body with high relative density even by performing sintering. For example, in the case of sintering TaC powder having a TaC purity of 99% or more, it is known that the relative density can be densified only up to 96% even when heating was performed up to 2500° C. (see JP 2009-137789 A1, paragraph 0008).

In the present invention, a sintered body is obtained by adding a small amount of Si to the above-mentioned metal carbide with a high-melting point and sintering the same. That is, by producing a sintered metal carbide containing 0.1 wtppm or more and 10,000 wtppm or less of Si element, a sintered metal carbide with high relative density and excellent mechanical strength can be realized without having to perform sintering under high pressure such as hot pressing or HIP. A carbide having a high melting point has low sintering properties, and it is difficult to obtain a dense sintered body without using a sintering aid in combination while sintering under normal pressure. As the sintering aid, one having a melting point lower than the sintering temperature is selected. That is, when the sintering aid is melted during sintering, the carbides are easily sintered to one another, and as a result, a dense sintered body is obtained. In the present invention, the use of a sintered metal carbide comprising an Si element in the above range makes it possible to obtain a sintered body having a high relative density and excellent mechanical strength even when the sintered carbide is of at least one metal selected from the group consisting of Groups 4 and 5 elements of the periodic table, without performing sintering at high pressure. When the content of the Si element contained in the sintered metal carbide is less than 0.1 wtppm, it is unlikely to obtain a sintered body having a relative density of 95% by with normal pressure sintering. On the other hand, when the content of the Si element exceeds 10,000 wtppm, a small amount of the Si element is released from the sintered body which is the heat-resistant member, so that the physical properties such as etch pit density of the SiC single crystal may be affected in the manufacturing process of the SiC single crystals or the SiC epitaxial growth film formation process. In view of obtaining a sintered metal carbide excellent in sintering properties, relative density, mechanical strength and the like under normal pressure, the Si element content is preferably 1 wtppm or more and 1,000 wtppm or less, and more preferably 10 wtppm or more and 100 wtppm or less. Note that, the content of the Si element in the sintered metal carbide can be determined by elemental analysis of the sintered body by a high-sensitivity glow discharge mass spectrometry (GD-MS) method.

Among the carbides of at least one metals selected from the group consisting of elements of Groups 4 and 5 of the periodic table, the metal carbide used in the sintered metal carbide of the present invention is preferably a carbide of Ta, Nb, Ti, and Zr, in view of heat resistance, and particularly preferably a carbide of Ta and Nb. These metal carbides may be used alone or 2 or more of these in combination. Note that, a metal carbide is a collective term of a compound composed of a metal element and carbon, and the composition ratio of the metal element and carbon is not limited as long as the compound is stably present. For example, tantalum carbide includes both TaC and $Ta_2C$, and both TaC particles and Ta2C particles may be included in the sintered body. Niobium carbide includes any one of NbC, $Nb_2C$ and $Nb_6C_5$, and any 1 or 2 or more of NbC particles, $Nb_2C$ particles, and $Nb_6C_5$ particles may be included in the sintered body.

The metal carbide as described above can be obtained by a known method, for example by mixing an oxide of a metal (titanium, zirconia, hafnium, niobium, tantalum, tungsten, etc.) with carbon and heating the mixture in a hydrogen reducing atmosphere. Alternatively, the metal carbide may be obtained by heat-treating a mixed solution which is obtained by adding to a metal alkoxide, an organic substance having a functional group (for example, an OH group or a COOH group) that is capable of coordinating to the metal as a carbon source, in a non-oxygen atmosphere.

The metal carbide used in the sintered metal carbide is preferably in a granular form. As the granular metal carbide, the use of a metal carbide having an average particle size of 0.05 to 20.0 μm is preferred, and a more preferable range of the average particle size is 0.1 to 10.0 μm. By using a granular metal carbide in such range, a denser sintered carbide can be obtained. The average particle size means an average particle size measured by an air permeation method using a Fischer subsieve sizer (Fischer size). The average particle size of the carbide can be appropriately adjusted according to the average particle size of the raw material (metal oxide) and the grinding conditions for grinding (crushing) the obtained carbide. When the grinding time is short, the particle size of the grinded material tends to be large, and when the grinding time is long, the particle size tends to be small.

$SiO_2$ can be used as the Si element source contained in the sintered metal carbide. That is, a sintered metal carbide can be obtained by preparing a composition for sintering in which an appropriate amount of $SiO_2$ is added to a metal carbide, molding the composition for sintering appropriately, and sintering the composition. The Si element content in the sintered metal carbide can be adjusted by controlling the SiO$_2$ content in the composition for sintering. In order to include the Si element content in the sintered metal carbide within the above range, the SiO$_2$ content is preferably in the range of 0.01 to 12 parts by mass, more preferably in the range of 0.06 to 3 parts by mass, and particularly preferably in the range of 0.2 to 0.9 parts by mass with respect to 100 parts by mass of the metal carbide; however it depends on the content of the content of other components in the composition and the sintering conditions.

In view of uniformly dispersing SiO$_2$ in the composition for sintering, SiO$_2$ is preferably in the form of particles having a small average particle size or in the form in which SiO$_2$ is dispersed in a medium such as water. When the SiO$_2$ is granular, preferably those with the average particle size in the range of 0.05 to 10.0 μm are used, and more preferably in the range of 0.1 to 5.0 μm. In addition, in the case of the form of a dispersion, preferred use is SiO$_2$ particles dispersed in the dispersion medium having the average particle size in the range of 0.001 to 0.5 μm and more preferably in the range of 0.005 to 0.1 μm. The definition of the average particle size is similar to the above description.

In obtaining the sintered metal carbide, a binder resin may be comprised in addition to the above metal carbide and SiO$_2$. The addition of the binder resin makes it easy to adjust the viscosity and handling of the composition for sintering, and also makes it possible to improve the formability when the composition for sintering is sintered into a sintered carbide. The binder resin is not particularly limited provided that the above effect can be obtained, and examples include a polyvinyl alcohol resin, an acrylic resin, a polyvinyl butyral resin, a methyl cellulose resin, an ethyl cellulose resin, an acetyl cellulose resin, a phenol resin, a urea resin, a melamine resin, and the like. 2 or more of these binder resins may be mixed and used. The preferred binder resin is a polyvinyl alcohol resin.

Since the content of the binder resin affects the viscosity of the composition for sintering, it can be appropriately adjusted according to the use purpose of the composition for sintering. That is, when the sintered body is used as a heat-resistant member, the content of the binder resin differs depending on whether the sintered body is used as a base material for the heat-resistant member or as a coating member for the base material, and generally the content is preferably in the range of 0.1 to 5.0 parts by mass with respect to 100 parts by mass of the metal carbide. When the content of the binder resin is in this range, the obtained sintered metal carbide can be suppressed from being distorted, and also generation of carbon precipitates derived from the binder resin can be suppressed. The preferable residual carbon rate after sintering is 0 to 3 mass %.

The composition for sintering may contain, in addition to the binder resin, an additive for improving the dispersibility of the metal carbide and SiO$_2$. For example, a polyethyleneimine polymer dispersant, a polyurethane polymer dispersant, a polyallylamine polymer dispersant and the like can be suitably used. The content of the additive is preferably in the range of 0.03 to 2.0 parts by mass with respect to 100 parts by mass of the metal carbide.

The composition for sintering may contain a solvent in addition to the binder resin and the additive. Examples of the solvent include organic solvents such as ethanol, benzyl alcohol, toluene, dimethylacetamide, methyl ethyl ketone, and the like and water, and 1 or 2 or more of these solvents can be used in combination. Since the content of the solvent affects the viscosity of the composition for sintering, the content can be appropriately adjusted according to the use purpose of the composition for sintering, and the preferred content is in the range of approximately 5.0 to 30.0 parts by mass with respect to 100 parts by mass of the carbide.

The sintered metal carbide according to the present invention can be obtained by molding the above-mentioned composition for sintering into a desired shape and sintering the same. For example, a sintered metal carbide can be obtained by kneading each of the above components by means of a ball mill, a kneader, a mixer, a high-speed stirrer, or the like to prepare a slurry, molding the slurry into a desired shape, and sintering the obtained molded body. Alternatively, the slurry may be formed into granules by means of a spray dryer and the like, and then the granules may be molded into a desired shape, and the obtained molded body may be sintered. The molding method for molding the composition for sintering into a desired shape is not particularly limited, and conventionally known molding methods can be employed such as press molding, extrusion molding, and casting.

After obtaining the molded body as described above, the molded body is sintered, and as a result, a sintering the molded body can be obtained in the desired shape. Sintering is carried out at a temperature of 2200 to 2600° C. and preferably 2250 to 2450° C. The SiO$_2$ melts at a temperature lower than the temperature at the start of sintering (about 1600 to 1700° C.) and acts as a sintering aid which makes it possible to densify the sintered body.

In the present invention, as described above, since a predetermined amount of Si element is comprised, a sintered body having a high relative density can be obtained without having to perform sintering under pressure. Therefore, there is no need to perform sintering under pressure such as hot pressing or HIP, which was conventionally required to obtain a sintered body having a high relative density, and a sintered body having a high relative density and excellent mechanical strength can be obtained by sintering at normal pressure even if the shape of the molded body is relatively complicated. Sintering is preferably carried out in an atmosphere of an inert gas such as argon or helium.

The sintered metal carbide obtained as described above has a relative density of 95% or more even when sintering was performed under normal pressure. In view of mechanical strength, the relative density of the sintered metal carbide is preferably 97.5% or more and more preferably 99% or more. Note that, the relative density is defined as a value of the ratio of the density of the sintered body (bulk density) to the theoretical density expressed in percentage, and can be measured in accordance with JIS-R1634. For example, when the density of TaC is 14.3 g/cm$^3$ and the density of SiO$_2$ is 2.65 g/cm$^3$, the density calculated by weighted average is the theoretical density, and the more the bulk density obtained by the Archimedes method is closer to 100% of the theoretical density, the sintered body is indicated to have a dense structure without defects such as voids.

Purity of the sintered metal carbide metal carbide (mass proportion of the metal carbide in the sintered body) is preferably 97.5% or more. By increasing the purity of the sintered metal carbide, corrosion resistance (resistance to reaction gas) of the heat-resistant member is improved when the sintered metal carbide is used as a heat-resistant member for a SiC semiconductor manufacturing device. Note that, the sintered metal carbide having a purity of 97.5% or more can be obtained by adjusting the composition of the composition for sintering so as to reduce the residual carbon ratio or by controlling the sintering temperature. Note that, the mass proportion of the metal carbide in the sintered body can be measured by an inductively-coupled plasma atomic emission spectrometry (ICP) method, an Auger electron spectroscopy (AES) method, an X-ray photoelectron spectroscopy (XPS) method, and the like.

The obtained sintered metal carbide has an extremely high relative density as described above, and pores may be present in the sintered body. In this case, the open porosity is preferably 1% or less and preferably 0.5% or less. The closed porosity is preferably 5% or less and preferably 3% or less. The open porosity (%) can be calculated by the Archimedes method in accordance with JIS-R1634, and the closed porosity (%) is a value (%) obtained by subtracting the ratio of the apparent density to the theoretical density as above from 1, expressed in percentage. Note that, the apparent density means a value measured in accordance with JIS-R1634. In general, the smaller the open porosity and the closed porosity, the sintered body can have higher mechanical strength.

The ratio of the open porosity to the closed porosity is preferably 0 to 0.5. The smaller the open porosity with respect to the closed porosity, the less pores present on the outer surface of the sintered body, which are likely to be the breaking source, thus the mechanical strength of the sintered body can generally be increased. When such a sintered body is used as a heat-resistant member for a SiC semiconductor manufacturing device, the surface area in contact with the atmospheric gas is reduced, and therefore the corrosion resistance of the heat-resistant member is improved.

Even when pores are present in the sintered metal carbide, the smaller the pores, the better from the viewpoint of corrosion resistance of the heat-resistant member, and the average size of the pores is preferably 50 µm or less and more preferably 10 µm or less. The average size of the pores can be calculated by mirror-polishing the cross-section of the cut sintered body, observing the cross-section with an electron microscope, observing the image at any magnification, and performing image analysis. Specifically, the observed region of the cross section can be divided into 2 regions of a sintered body portion (matrix region) and a pore portion (non-matrix region), and the size of the pores existing in the predetermined range of the cross section (for example, a range of 1 mm×1 mm) can be measured and calculated as an average value thereof. The maximum size of the pores is preferably 100 µm or less and more preferably 50 µm or less.

The shape of the pores is preferably substantially circular from the viewpoint of enhancing strength and improving corrosion resistance, and the aspect ratio of the pores is preferably in the range of 1 to 2. The aspect ratio of the pores is a value obtained by approximating a pore to an ellipsoid from image analysis of a cross-section of a sintered body by observation with an electron microscope, measuring the major axis and the minor axis, and dividing the major axis by the minor axis.

The grain size of the sintered metal carbide is preferably in the range of 5 to 500 µm and more preferably in the range of 10 to 100 µm. In the present invention, since the sintered body contains a predetermined amount of Si element as described above, the sintering temperature at the time of obtaining the sintered body can be lowered, and the crystal grain size can be prevented from being coarsened. As a result, a sintered metal carbide excellent in mechanical strength and corrosion resistance can be obtained. The crystal grain size can be calculated by performing mirror-polishing and performing etching of the cross-section of the sintered body as described above and then carrying out observation of the cross-section and image analysis.

The sintered metal carbide according to the present invention preferably has a total emissivity at 25° C. measured in accordance with JIS R1693-2:2012 of 10% or more and 40% or less and more preferably 15% or more and 35% or less. The use of the sintered metal carbide having such thermal characteristics as a heat-resistant member for a semiconductor manufacturing device, the temperature in the film forming device can be efficiently increased.

The sintered metal carbide according to the present invention preferably has a bending strength of 200 MPa or more and more preferably 250 MPa or more. The bending strength means 3 point bending strength at room temperature (25° C.) measured in accordance with JIS R1601. The use of a sintered metal carbide having a bending strength of 200 MPa or more as a heat resistant member of a semiconductor manufacturing device improves the durability of the device.

The sintered metal carbide according to the present invention preferably has a surface roughness Ra of 0.01 to 10 µm and more preferably 0.1 to 5 µm. The surface roughness Ra can be in the above range by making a sintered metal carbide that is dense as having a relative density of 95% or more and by polishing the surface of the sintered body. As a result, when the sintered metal carbide is used as a heat-resistant member and the like for a semiconductor manufacturing device, it can be easily adhered to the base material, and also the corrosion resistance of the heat-resistant member is improved. Note that, the surface roughness Ra can be calculated by measurement in accordance with JIS B0601: 2013.

Heat-Resistant Member for Silicon Carbide Semiconductor Manufacturing Device

As described above, the sintered metal carbide according to the present invention is a sintered body of a metal carbide having an extremely high melting point, and since the sintered body contains a predetermined amount of Si element, it is possible to realize a sintered metal carbide having a high relative density and excellent mechanical strength without having to perform sintering under pressure such as hot pressing or HIP. Therefore, it can be suitably used as a heat-resistant member in a device for producing silicon carbide (SiC) single crystal bulks or a heat-resistant member in a film-forming device for producing silicon carbide semiconductor wafers.

Further, even if the metal carbide is sintered under normal pressure, a sintered metal carbide can be obtained having a high relative density and excellent mechanical strength, therefore a molded body can be prepared before sintering, and a heat-resistant member can be produced having a desired shape by sintering the molded body. For example, a sintered metal carbide can be suitably used as a crucible member for manufacturing silicon carbide (SiC) single crystal bulks a wall member of a film forming device for manufacturing silicon carbide semiconductor wafers, and the like.

In the embodiments of the present invention, the heat-resistant member may be composed only of the sintered metal carbide, or may be a heat-resistant member having a structure in which a layer consisting of the sintered metal carbide is coated on the surface of a base material.

EXAMPLES

Next, the embodiments of the present invention will be described in details with reference to the following Examples; however, the present invention is not limited to these Examples.

Preparation of Metal Carbide

The following 3 kinds of metal carbides were prepared as the metal carbides.

(1) Tantalum carbide (Mitsui Mining & Smelting Co., Ltd., Fischer size 1 μm, purity 99.9%)
(2) Niobium carbide (Mitsui Mining & Smelting Co., Ltd., Fischer size 1 μm, purity 99.9%)
(3) Zirconium carbide (manufactured by Japan New Metals Co., Ltd., Fisher size 3 μm, purity 99.5%)
(4) Titanium carbide (Manufactured by Japan New Metals Co., Ltd., Fisher size 1 μm, purity 99.5%)

Examples 1 to 3, 5 to 8 and Comparative Examples 1 and 2

Each of the above-mentioned metal carbides and a $SiO_2$ dispersion liquid (particle size: 0.02 μm) were mixed to the composition shown in Table 1, and to the mixture were added 0.5 parts by mass of a polyethyleneimine polymer dispersion liquid as a dispersant based on 100 parts by mass of the metal carbide, 0.5 parts by mass of polyvinyl alcohol as a resin binder based on 100 parts by mass of the metal carbide, and 10 parts by mass of water as a solvent to 100 parts by mass of the metal carbide. Note that, the $SiO_2$ content in Table 1 represents the solid content in the $SiO_2$ dispersion.

The obtained mixture was mixed with a ball mill for 4 hours to prepare a slurry for sintering. The obtained slurry for sintering was granulated by a spray dryer. Next, the obtained granules were filled in a molding die, and a molded body having a size of 100 mm×10 mm was produced by a CIP method (cold hydrostatic pressure molding).

The molded body obtained as described above was sintered at a temperature of 2300° C. under an argon atmosphere for 10 hours under normal pressure to obtain a sintered body.

Example 4

The above-mentioned metal carbide (zirconium carbide) and $SiO_2$ powder (particle size: 1 μm) were mixed to the composition shown in Table 1 below, and to the mixture were added, 0.5 parts by mass of a polyethyleneimine polymer dispersion as a dispersant based on 100 parts by mass of the metal carbide, 0.5 parts by mass of an acrylic emulsion as a resin binder based on 100 parts by mass of the metal carbide, and 10 parts by mass of water as a solvent based on 100 parts by mass of the metal carbide.

The obtained mixture was mixed with a ball mill for 4 hours to prepare a slurry for sintering. The obtained slurry for sintering was used to perform cast molding and a molded body having a size of 100 mm×10 mm was prepared.

The molded body obtained as described above was sintered at a temperature of 2300° C. under an argon atmosphere for 10 hours with normal pressure to obtain a sintered body.

Evaluation

Each of the sintered bodies of Examples 1 to 8 and Comparative Examples 1 and 2 obtained as described above were evaluated as follows.

(1) Measurement of Content of Si Element

Elemental analysis was performed against the sintered body by glow discharge mass spectrometry (GD-MS). As a result, the content of the Si element in each sintered body was as shown in Table 1 below.

(2) Measurement of Relative Density

The relative density of the sintered body was measured. The theoretical density was calculated from the densities of the metal carbide and $SiO_2$, the bulk density was calculated by the Archimedes method in accordance with JIS-R1634, and the relative density was determined from the ratio of the bulk density to the theoretical density. As a result, the relative density of each sintered body was as shown in Table 1 below.

(3) Measurement of Purity

From the results of elemental analysis of the sintered bodies above by glow discharge mass spectrometry (GD-MS), the total content of all elements was defined as the impurity content (mass %), and the value obtained by subtracting the impurity content from 100 was defined as the purity of the sintered body. As a result, the purity of each sintered body was as shown in Table 1 below.

(4) Measurement of Open Porosity and Closed Porosity

The open porosity of the sintered body was calculated by the Archimedes method in accordance with JIS-R1634. The apparent density was calculated by measurement in accordance with JIS-R1634, and a value obtained by subtracting the ratio of the apparent density to the theoretical density calculated above from 1 was calculated as the closed porosity. As a result, the open porosity and the closed porosity of each sintered body were as shown in Table 1 below.

(5) Measurement of Average Pore Size, Maximum Pore Size and Pore Aspect Ratio

The sintered body was cut and the cut face was polished to make an observation face, and the average pore size was determined from a secondary electron image (SEI) obtained by photographing the observation face using a scanning electron microscope. Specifically, the secondary electron image was comparted by a square grid of 100 μm×100 μm at a given position, the grid was divided into 2 regions of a sintered body portion (a matrix region) and a pore portion (a non-matrix region), the sizes of any pores (100 pores) in the non-matrix region were measured, and the average value thereof was employed as the average pore size. The maximum size of the pores therein was defined as the maximum pore size.

The aspect ratio of the pores was obtained by approximating any pores (100 pores) in the non-matrix region to an ellipsoid, and the major axes and the minor axes were measured and values by dividing the major axes by the minor axes were obtained, and the average value thereof was used as the pore aspect ratio.

As a result, the average pore size, the maximum pore size, and the pore aspect ratio of each sintered body were as shown in Table 1 below.

(6) Measurement of Surface Roughness Ra

The sintered body was mirror-finished, and the surface roughness Ra after finishing was measured in accordance with JIS-B0601:2013. As a result, the surface roughness Ra of each sintered body was as shown in Table 1 below.

(7) Measurement of Total Emissivity

The total emissivity of the sintered body after mirror finishing as above was measured in accordance with JIS-R1693-2:2012. As a result, the total emissivity of each sintered body was as shown in Table 1 below.

(8) Measurement of Bending Strength

The sintered body was processed to 3 mm×4 mm×50 mm, and the 3 point bending strength in accordance with JIS-R 1601:2008 was measured. As a result, the bending strength of each sintered body was as shown in Table 1 below.

(9) Performance Evaluation as Heat-Resistant Member for Silicon Carbide Semiconductor Manufacturing Device The high-temperature heat-resistant member of the silicon carbide semiconductor manufacturing device is replaced with a high-temperature heat-resistant member consisted of the sintered body described above, and a silicon carbide single crystal was manufactured using said silicon carbide semiconductor manufacturing device. The etch pit density of the obtained silicon carbide single crystal was measured. The etch pit density (EPD) was obtained by etching the surface of a silicon carbide single crystal with KOH, observing 10 areas of 1 mm square of a given portion of the surface with an optical microscope in a magnification of 100 to 200 times, counting the number of dislocations present in each area, and multiplying the average value thereof by 100 (unit: 2/cm$^2$). Note that, a silicon carbide single crystal with a small etch pit density is classified as having a good quality of the single crystal, and a silicon carbide single crystal with a large etch pit density is classified as having a poor quality of the single crystal, and is classified as being unacceptable. From the quality of the obtained single crystal, the heat-resistant member was evaluated according to the following evaluation standards.

AA: The quality of the silicon carbide single crystal is in a level classified as "excellent" (etch pit density is less than 3,000/cm$^2$).

A: The quality of the silicon carbide single crystal is in a level classified as "good" (etch pit density is 3,000 dislocations/cm$^2$ or more and less than 5,000 dislocations/cm$^2$).

B: The quality of the silicon carbide single crystal is in a level classified as "acceptable" (etch pit density is 5,000 dislocations/cm$^2$ or more and less than 10,000 dislocations/cm$^2$)

C: The quality of the silicon carbide single crystal is in a level classified as "unacceptable" (etch pit density is 10,000 dislocations/cm$^2$ or more).

The evaluation of the performance of the heat-resistant member when the sintered body was used as the heat-resistant member was as shown in Table 1 below. In the silicon carbide semiconductor manufacturing device using the sintered body of Comparative Example 1, the strength of the high-temperature heat-resistant member was too low to manufacture a silicon carbide single crystal, and it was not possible to carry out the evaluation.

produced silicon carbide single crystal was poor when the sintered material was used for a high-temperature heat-resistant member of a silicon carbide semiconductor manufacturing device, and it can be understood that no good product was obtained.

The invention claimed is:

1. A sintered metal carbide of at least one metal selected from the group consisting of Ta and Nb, comprising:
   0.1 wtppm or more and 100 wtppm or less of Si element.

2. The sintered metal carbide according to claim 1, wherein a relative density of the sintered metal carbide is 95% or more.

3. The sintered metal carbide according to claim 1, wherein the sintered metal carbide includes pores and an average size of the pores is 50 μm or less.

4. The sintered metal carbide according to claim 1, wherein the sintered metal carbide has a closed porosity of 5% or less.

5. The sintered metal carbide according to claim 1, wherein a total emissivity at 25° C. of the sintered metal carbide measured in accordance with JIS R 1693-2:2012 is 10% or more and 40% or less.

6. A heat-resistant member for a silicon carbide semiconductor manufacturing device, comprising:
   a sintered metal carbide of at least one metal selected from the group consisting of Ta and Nb, comprising:
      0.1 wtppm or more and 100 wtppm or less of Si element.

7. The heat-resistant member according to claim 6, wherein a relative density of the sintered metal carbide is 95% or more.

8. The heat-resistant member according to claim 6, wherein the sintered metal carbide includes pores and an average size of the pores is 50 μm or less.

TABLE 1

| | | Ex 1 | Ex 2 | Ex 3 | Ex 4 | Ex 5 | Ex 6 | Ex 7 | Ex 8 | Comp. Ex 1 | Comp. Ex 2 |
|---|---|---|---|---|---|---|---|---|---|---|---|
| Composition for sintering | Kind of Metal Carbide | TaC | TaC | TaC | TaC | TaC | NbC | ZrC | TiC | TaC | TaC |
| | Content of Metal Carbide (mass %) | 99.98 | 99.79 | 99.15 | 97.26 | 89.9 | 99.36 | 99.36 | 99.36 | 100 | 84.31 |
| | Content of SiO$_2$ (mass %) | 0.02 | 0.21 | 0.85 | 2.74 | 10.1 | 0.64 | 0.64 | 0.64 | 0 | 15.69 |
| Evaluation result of sintered bodies | Content of Si Element(wtppm) | 0.15 | 14 | 90 | 9800 | 65 | 80 | 100 | 100 | 0.05 | 15000 |
| | Relative density (%) | 95.1 | 97.5 | 97.6 | 98.1 | 99.8 | 97.7 | 97.6 | 97.6 | 90.2 | 98.7 |
| | Purity (%) | 99.99 | 99.96 | 99.94 | 99.9 | 98.9 | 99.95 | 99.94 | 99.94 | 99.99 | 98.4 |
| | Open Porosity (%) | 0.8 | 0.1 | 0.1 | 0.1 | 0 | 0.2 | 0.2 | 0.3 | 5.3 | 0 |
| | Closed Porosity (%) | 4.1 | 2.4 | 2.3 | 1.8 | 0.2 | 2.1 | 2.2 | 2.1 | 4.5 | 1.3 |
| | Average Pore Size(μm) | 35 | 10 | 9 | 9 | 9 | 9 | 9 | 9 | 120 | 10 |
| | Maximum Pore size(μm) | 90 | 45 | 45 | 45 | 40 | 45 | 45 | 45 | 300 | 45 |
| | Pore Aspect ratio | 1.4 | 1.3 | 1.3 | 1.2 | 1.2 | 1.3 | 1.3 | 1.3 | 1 | 1.2 |
| | Surface Roughness Ra(μm) | 1 | 0.8 | 0.7 | 0.7 | 0.7 | 0.8 | 0.8 | 0.8 | 3 | 0.7 |
| | Total emissivity (%) | 19 | 19 | 19 | 19 | 20 | 18 | 20 | 20 | 19 | 19 |
| | Bending Strength (MPa) | 260 | 350 | 360 | 380 | 420 | 340 | 340 | 310 | 150 | 320 |
| | Evaluation of Performance of Heat Resistant Member | A | AA | AA | A | B | A | A | A | — | C |

As it is apparent from the evaluation results in Table 1, it can be seen that the metal carbide sintered bodies (Examples 1 to 8) having the Si element content of 0.1 wtppm or more and 10,000 wtppm or less have higher relative density and superior mechanical strength than the sintered metal carbide (Comparative Example 1) having the Si element content of less than 0.1 wtppm. In addition, although the sintered metal carbide (Comparative Example 2) having the Si element content of more than 10,000 wtppm has a high relative density and excellent mechanical strength, the quality of the 9. The heat-resistant member according to claim 6, wherein the sintered metal carbide has a closed porosity of 5% or less.

10. The heat-resistant member according to claim 6, wherein a total emissivity at 25° C. of the sintered metal carbide measured in accordance with JIS R 1693-2:2012 is 10% or more and 40% or less.

* * * * *